United States Patent
Lee et al.

(10) Patent No.: US 6,914,318 B2
(45) Date of Patent: *__Jul. 5, 2005__

(54) INTERCONNECT STRUCTURE WITH AN ENLARGED AIR GAPS DISPOSED BETWEEN CONDUCTIVE STRUCTURES OR SURROUNDING A CONDUCTIVE STRUCTURE WITHIN THE SAME

(75) Inventors: Ellis Lee, Taipei (TW); Tsing-Fong Hwang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/670,012

(22) Filed: Sep. 23, 2003

(65) Prior Publication Data

US 2004/0056358 A1 Mar. 25, 2004

Related U.S. Application Data

(60) Division of application No. 09/971,471, filed on Oct. 5, 2001, now Pat. No. 6,888,247, which is a continuation-in-part of application No. 09/389,823, filed on Sep. 3, 1999, now Pat. No. 6,077,767, and a continuation-in-part of application No. 09/545,651, filed on Apr. 10, 2000, now abandoned.

(51) Int. Cl.[7] .............................................. H01L 29/00
(52) U.S. Cl. ..................................... 257/522; 257/758
(58) Field of Search ................................. 257/276, 522, 257/758, 704; 438/319, 411, 421, 619

(56) References Cited

U.S. PATENT DOCUMENTS 5,641,712 A * 6/1997 Grivna et al. ............... 438/624
5,668,398 A * 9/1997 Havemann et al. .......... 257/522
5,759,913 A * 6/1998 Fulford et al. .............. 438/624
5,814,555 A * 9/1998 Bandyopadhyay et al. . 438/619
6,136,687 A * 10/2000 Lee et al. .................... 438/624
6,303,464 B1 * 10/2001 Gaw et al. .................. 438/422
6,423,630 B1 * 7/2002 Catabay et al. ............. 438/624

* cited by examiner

Primary Examiner—S. V. Clark
(74) Attorney, Agent, or Firm—J.C. Patents

(57) ABSTRACT

An interconnect is formed on the substrate. The conductive structure at least includes a first conductive structure and a second conductive structure, which have a gap region in-between. The substrate is exposed at the gap region. A first structured dielectric layer is formed over the substrate to cover the first and the second conductive structures. The first structured dielectric layer also has a void at the gap region between the first and the second conductive structures. The void significantly extends to the whole gap region. The first structured dielectric layer also has an indent region above the void. An anti-etch layer fills the indent region of the first structured dielectric layer. As a result, the first structured dielectric layer has a substantially planar surface. A second structured dielectric layer is formed on the first structured dielectric layer and the anti-etch layer. The first structured dielectric layer and the second structured dielectric layer also have an opening to expose the conductive structure. When the opening is shifted to the gap region between the first conductive structure and the second conductive structure due to misalignment, the portion of the opening above the gap region stops on the anti-etch layer without opening the void.

35 Claims, 10 Drawing Sheets

INTERCONNECT STRUCTURE WITH AN ENLARGED AIR GAPS DISPOSED BETWEEN CONDUCTIVE STRUCTURES OR SURROUNDING A CONDUCTIVE STRUCTURE WITHIN THE SAME

CROSS-REFERENCE TO RELATED APPLICATION

This application is a divisional application of, and claims the Priority benefit of, U.S. application Ser. No. 09/971,471, filed Oct. 5, 2001, now U.S. Pat. No. 6,888,247, which is a continuation-in-part of applications Ser. No. 09/389,823, filed Sep. 3, 1999, now granted as U.S. Pat. No 6,077,767, and Ser. No. 09/545,651, filed Apr. 10, 2000, now abandoned.

BACKGROUND OF THE INVENTION

1. Field of Invention

The present invention relates to a semiconductor device. More particularly, the present invention relates to a structure of a multilevel interconnect.

2. Description of Related Art

The current integrated circuit device includes not only a field effect transistor (FET) and a bipolar device formed on the semiconductor substrate, but also a multilevel interconnect structure formed on the device. Different devices on the substrate can be connected by means of the multilevel interconnect structure. Among many integrated circuits, the multilevel interconnect structure extends in parallel with one or more arrays of conducting wires, while providing the function of the conducting wires in the devices formed by high integration stacking. When the size of the device is shrunk, an intermetal capacitance between the conducting wires obviously increases. As the data is transmitted with the conducting wires, unnecessary capacitive and inductive couplings are produced between the adjacent conducting wires in a narrow space. Such capacitive and inductive couplings reduce the speed for data transmission, especially during high-speed data transmission, while the increased energy consumption in this case also limits the efficiency of the device.

Referring to FIG. 1, an air gap 106 is formed in a dielectric layer between the conducting wires 102 in order to reduce the capacitive and inductive couplings between the multilevel interconnects. As the air has a smaller dielectric constant (about 1), the inter-metal dielectric (IMD) made with the air gap between the multilevel interconnects can reduce the dielectric constant and the capacitance between the parallel conducting wires, while improving the data transmission speed and the device efficiency.

Since a misalignment or an increase in critical dimension (CD) of an unlanded via opening (not shown) may occur during the formation of via opening 112, it is not easy to control an etching stopping point when the dielectric layers 110, 108, and 104 are made of similar materials. As a result, the via opening 112 can easily penetrate through the dielectric layers 110, 108, and 104, so that the air gap 106 is breached, resulting in an opening 106a extending form the via opening 112 and the air gap 106. The air gap 106 is not easily filled with a barrier layer 114, when the barrier layer 114 is formed by chemical vapor deposition (CVD) to cover the dielectric layer 110 and the profile of the via opening 112. Therefore, the reactant gas $WF_6$ diffuses into the air gap 106 and reacts with the oxide in the dielectric layer, producing a poisoned via in the subsequent step for forming the tungsten plug (not shown).

SUMMARY OF THE INVENTION

The invention provides a structure of an interconnect that is briefly described as follows. A conductive structure is formed on a substrate. The conductive structure at least includes a first conductive structure and a second conductive structure, which have a gap region in-between. The substrate is exposed at the gap region. A first structured dielectric layer is formed over the substrate to cover the first and the second conductive structures. The first structured dielectric layer also has a void at the gap region between the first and the second conductive structures. The void significantly extends to the whole gap region. The first structured dielectric layer also has an indent region above the void. An anti-etch layer fills the indent region of the first structured dielectric layer. As a result, the first structured dielectric layer has a substantially planar surface. A second structured dielectric layer is formed on the first structured dielectric layer and the anti-etch layer. The first structured dielectric layer and the second structured dielectric layer also have an opening to expose the conductive structure. When the opening is shifted to the gap region between the first conductive structure and the second conductive structure due to misalignment, the portion of the opening above the gap region stops on the anti-etch layer without opening the void.

In the foregoing, the gap region between the first conductive structure and the second conductive structure do optionally extend into the substrate, so that a dimension of the void is increased.

The first structured dielectric layer further includes a cap dielectric layer on the conductive structure, wherein the opening also penetrates the cap dielectric layer.

The first structured dielectric layer further includes a liner layer over the substrate, conformal to a topographic surface of the conductive structure and the substrate.

The invention also provides another interconnect structure. A conductive structure is formed on a substrate. The conductive structure at least includes a first conductive structure and a second conductive structures. A cap dielectric layer is formed on the conductive structure. The first conductive structure and the second conductive structure are separated by a gap region in-between. A first dielectric layer is formed over the substrate to cover the first and the second conductive structures with the doped dielectric layer. The first dielectric layer has a void at the gap region between the first and the second conductive structures. The void significantly extends to the whole gap region. The first dielectric layer also has an indent region above the void. A second dielectric layer is formed on the first structured dielectric layer, in which the indent region is filled. The first dielectric layer and the second dielectric layer also have an opening to expose the conductive structure, wherein the cap dielectric layer is penetrated. When the opening is shifted to the gap region between the first conductive structure and the second conductive structure due to misalignment, the portion of the opening above the gap region stops in the first dielectric layer without opening the void.

In the foregoing, the gap region optionally extends into the substrate, whereby the dimension of the void is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention particularly forms a void between conductive structures of an interconnect by depositing a dielectric layer with loose step coverage. The void is intended to be sufficiently large to effectively reduce at least the parasitic capacitance on the inter-metal dielectric layer. Several embodiments are to be described.

First Embodiment

FIGS. 2A to 2E are cross-sectional views, schematically illustrating a method for fabricating the multilevel interconnect according to the preferred embodiment of the invention.

Figure 1:
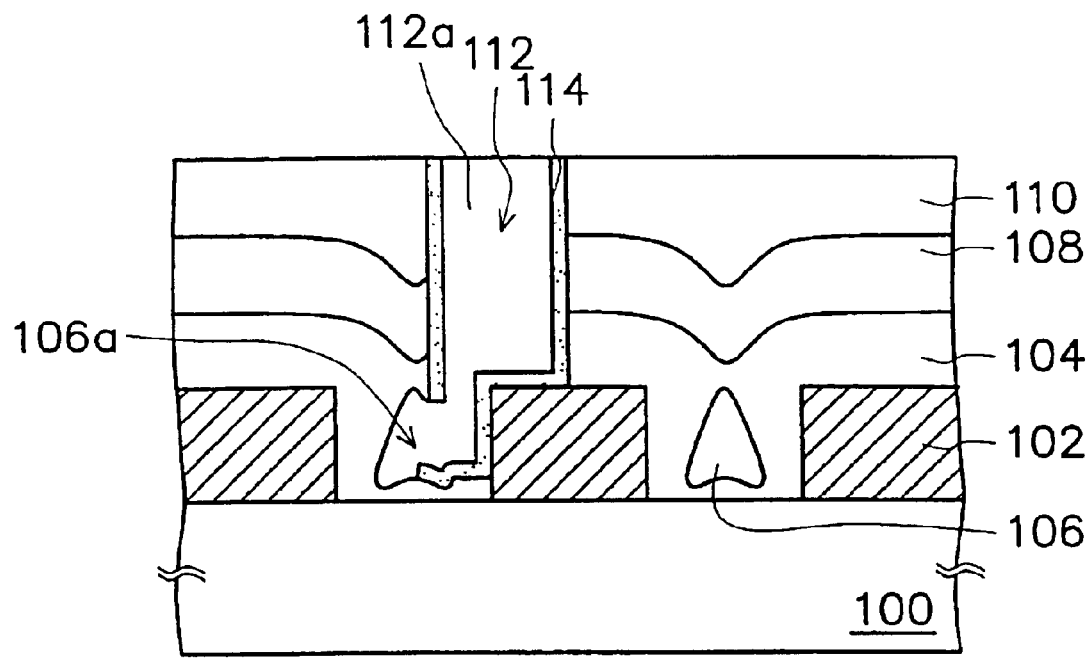
FIG. 1 is a schematic diagram illustrating the via opening which penetrates the first dielectric layer and connects to the air gap when misalignment occurs in the prior art.
Figure 2A:
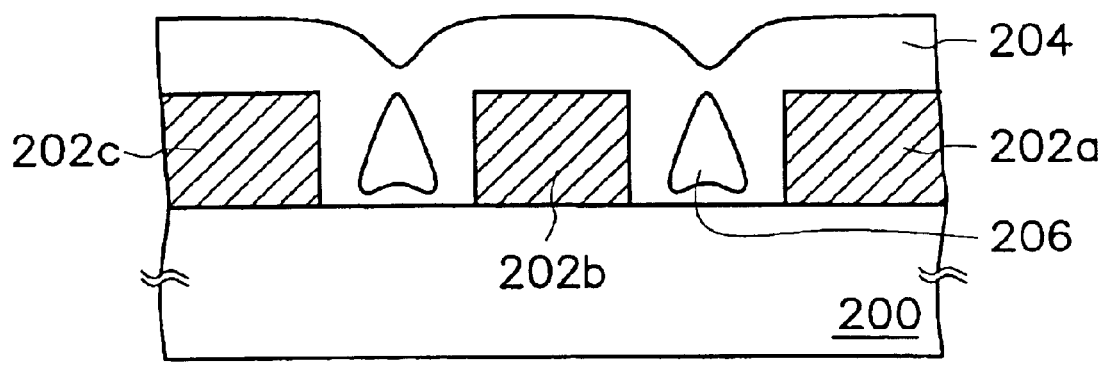
FIGS. 2A to 2E are cross-sectional views, schematically illustrating a method for fabricating an interconnect according to a first preferred embodiment of the invention.

Referring to FIG. 2A, a substrate formed with semiconductor devices (not shown) is provided. A conductive structure is formed on the substrate 200. The conductive structure includes at least two sub-conductive structures, such as conducting wires 202a, 202b, 202c, formed on the substrate 200. The conducting wires 202a, 202b, 202c usually form one level of a multilevel interconnect of the device. The conductive structure includes, for example, doped polysilicon or metal materials such as aluminum, copper, tungsten, metal or metal alloy thereof. For a clear description, the conducting wires 202a, 202b, 202c can also be briefly numbered as the conductive structure 202. The conductive wires 202a, 202b, 202c are separated by a gap region. A dielectric layer 204 is formed to cover the substrate 200 and the conductive structure 202, wherein a void 206 is formed in the dielectric layer 204 at the gap region between the conducting wires 202a, 202b, 202c. The void 206, for example, is formed due to requiring a loose step coverage or even a poor step coverage. As a result, the void 206 significantly extends to the whole gap region. Preferably, the dielectric layer 204 includes silicon oxide or doped oxide.

The dielectric layer 204 can be formed by plasma enhanced chemical vapor deposition (PECVD), and has a thickness approximately between 2000–4000 Å. A thickness of 3000 Å on the conducting wires 202 is preferred. When the (Yap region between the conducting wires 202a, 202b, 202c is filled with the dielectric layer 204 made from the material resulting poor step coverage, an overhang is formed on the top corners of the conductive wires 202a, 202b, 202c. This makes it difficult to fill the whole space of the gap region. The overhangs on the corners close the gap region and forms the void 206 in the dielectric layer 204 at the gap region. Due to the gap region, the dielectric layer 204 also has an indent region above the void 206.

Figure 2B:
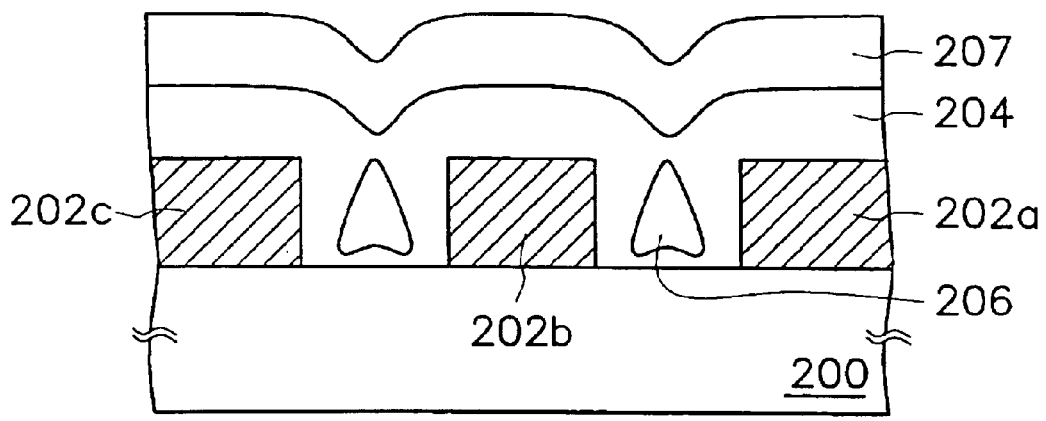

Referring to FIG. 2B, an anti-etch layer 207 is formed on the dielectric layer 204, wherein the anti-etch layer 207 has a smaller etching rate than the dielectric layer 204. The anti-etch layer 207 is preferably made of, for example, silicon nitride, aluminum oxide, aluminum nitride, titanium oxide, silicon carbide, and aluminum silicate formed by chemical vapor deposition (CVD) such as PECVD or photoinduced chemical vapor deposition (PICVD).

Figure 2C:
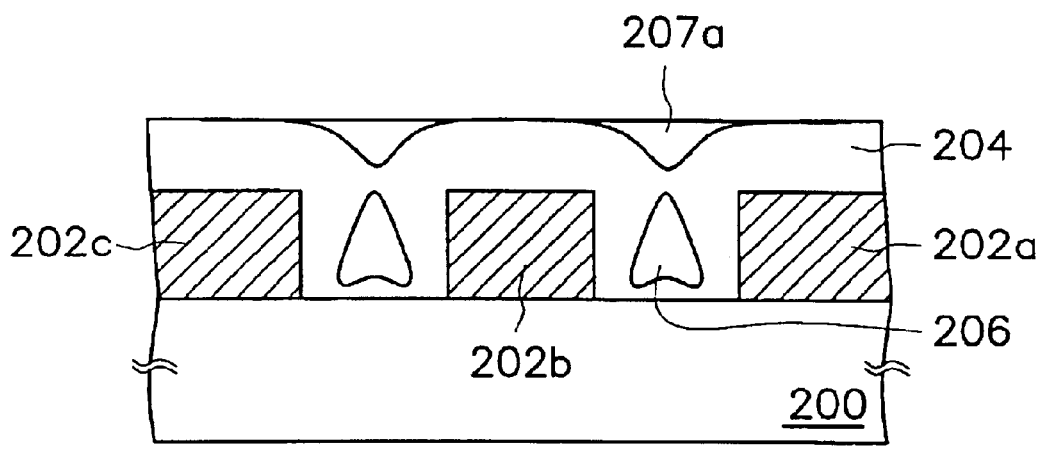

Referring to FIG. 2C, a part of the anti-etch layer 207 is removed until a part of the dielectric layer 204 is exposed, so that a remaining anti-etch layer 207a fills the indent region. The anti-etch layer 207a in general is a mask layer to mask the void 206 as can be seen later. To remove the part of the anti-etch layer 207, a planarization process, such as a chemical mechanical polishing (CMT) process or an etching back process, is employed. The anti-etching layer 207a has its function to stop an etching process in the subsequent process as is to be described later.

In general, the anti-etch layer is not only formed by using the foregoing mechanism even though it is more simple. The anti-etch layer over the void 206 can be formed by directly patterning the anti-etch layer by an additional photolithography step. In this manner, the geometric structure of the anti-etch layer 207a is different. For example, it may be a damascened layer in the dielectric layer 204 over the void 206.

Figure 2D:
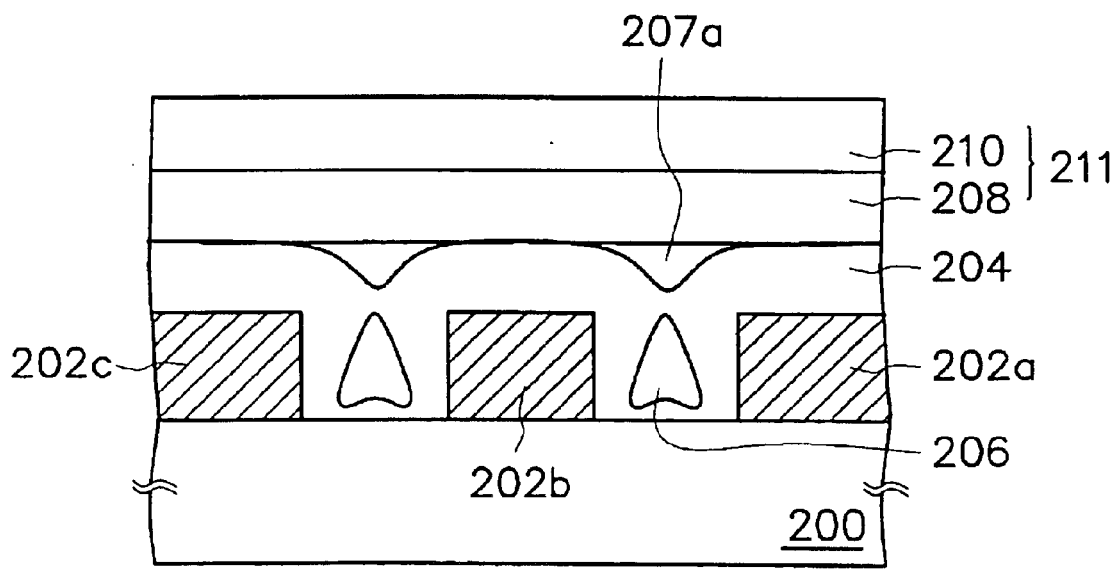

Referring to FIG. 2D, a dielectric layer 211 is formed on the dielectric layer 204 and the anti-etch layer 207a. The dielectric layer 211, for example, can include multiple layers 208, 210 sequentially formed on the substrate 200. The dielectric layer 211 have a larger etching rate than the anti-etch layer 207a. The dielectric layer 208 may include the silicon oxide layer formed by high-density plasma chemical vapor deposition (HDPCVD), while the dielectric layer 210 may include the silicon oxide layer formed by plasma enhanced chemical vapor deposition (PECVD).

Figure 2E:
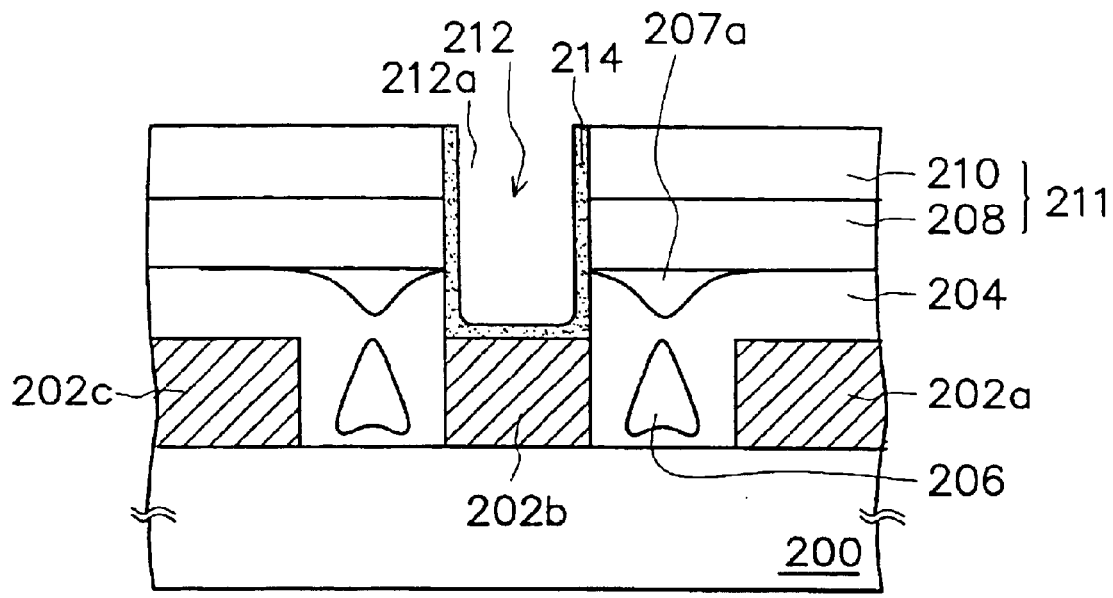

Referring to FIG. 2E, the dielectric layers 211, 204 are patterned to form an opening 212, such as a via, which penetrates dielectric layers 211, 204 and exposes, for example, the conducting wire 202b. A barrier layer 214 is then formed to cover a peripheral surface of the opening 212, where the barrier layer 214 contact the exposed portion of the conductive wire 202b. The barrier layer 214 may include a titanium/titanium nitride layer. A via plug is formed to fill the via opening 212, wherein the via plug may be a tungsten plug.

Figure 3:
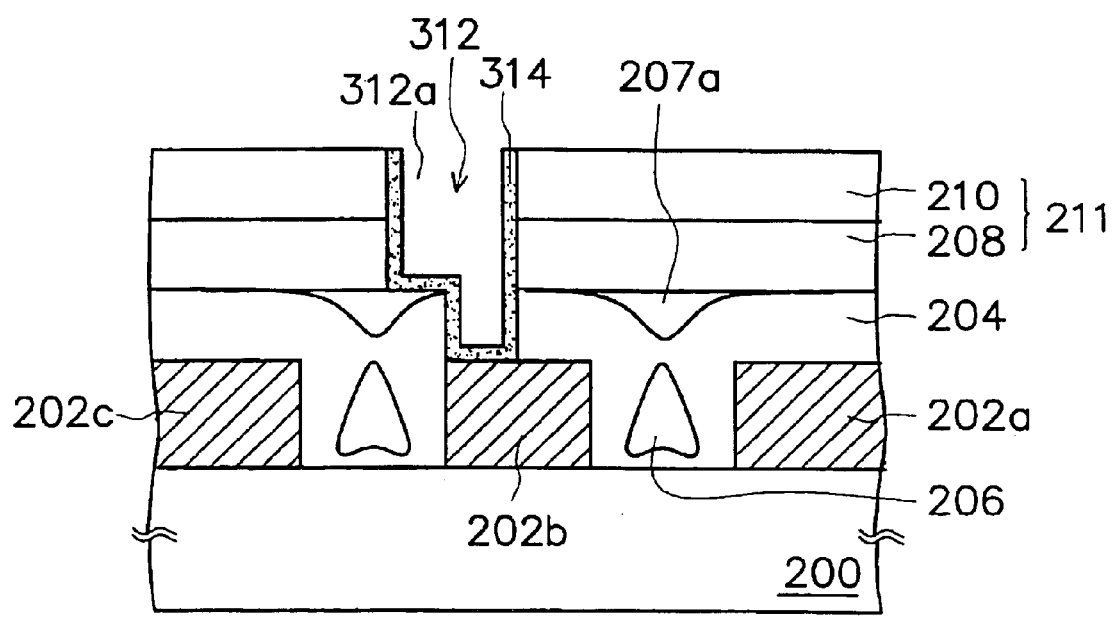
FIG. 3 is schematic diagram illustrating the via opening when misalignment occurs

Referring to FIG. 3, if a misalignment occurs during the formation of the opening, a misaligned opening 312 is formed. The opening 312 is shifted to the gap region. In FIG. 3, the elements with the same reference numbers represent the same elements in FIG. 2E. Since the anti-etch layer 207a has a smaller etching rate relative to the dielectric layer 204. In other words, the anti-etch layer 207a is a mask layer serving as an etching stop. As a result, the portion of the opening 312 above the gap region stops on the anti-etching layer 207a or just an upper portion of the anti-etching layer 207a being etched without opening the void 206. The void 206 reduces the parasitic capacitance in the inter-metal dielectric layer of the interconnecting structure.

Figure 3A:
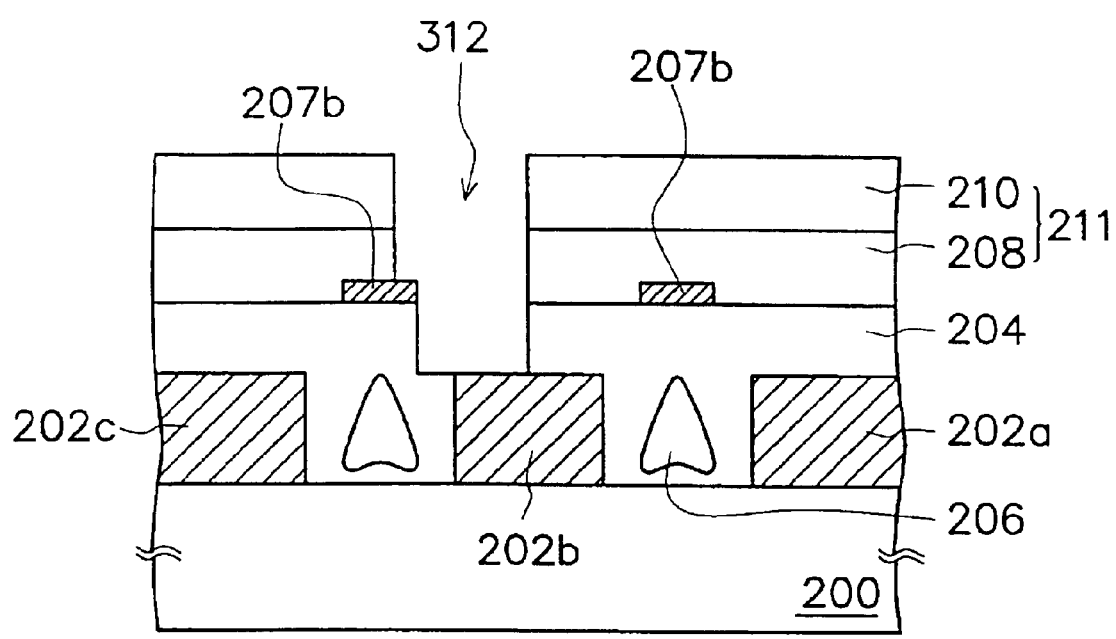
FIG. 3A is schematic diagram illustrating another interconnect structure according to the first preferred embodiment of the invention.

FIG. 3A is schematic diagram illustrating another interconnect structure according to the first preferred embodiment of the invention. The anti-etch layer 207b over the void 206 is formed by directly patterning the anti-etch layer by an additional photolithography step. In this manner, the geometric structure of the anti-etch layer 207b is different and met requirements of designs. Furthermore, it can also be a damascened layer in the dielectric layer 204 over the void 206.

Second Embodiment

Figure 4A:
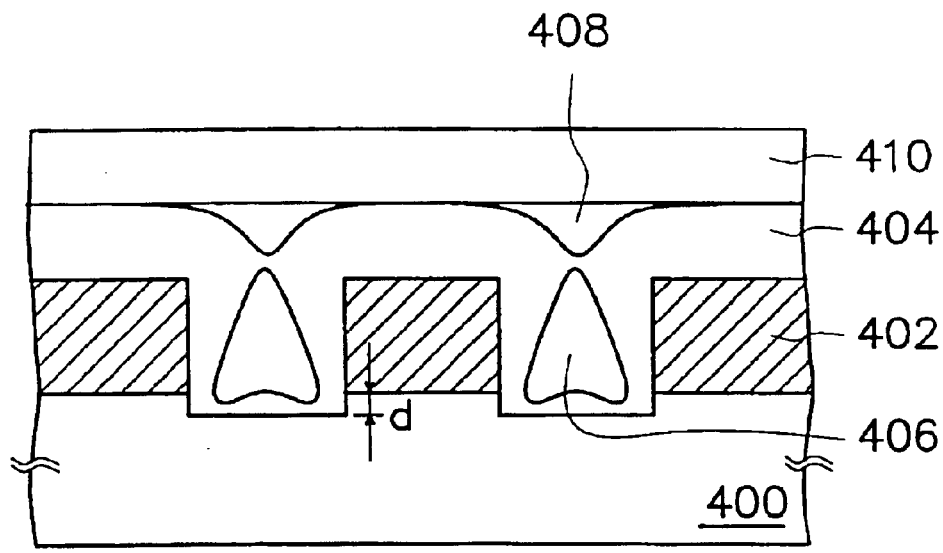
FIGS. 4A–4B are cross-sectional views, schematically illustrating a method to form an interconnect, according to a second preferred embodiment of the invention.
Figure 4B:
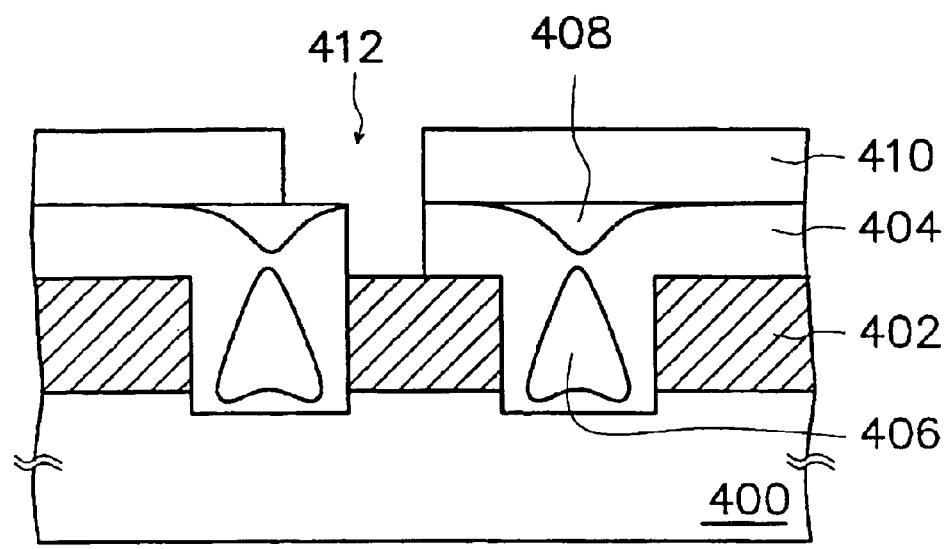

FIGS. 4A–4B are cross-sectional views, schematically illustrating a method to form an interconnect, according to a second preferred embodiment of the invention. The second embodiment is similar to the first embodiment. The difference is that the gap region now extends into the dielectric layer. As a result, the dimension of the void is increased. In FIG. 4A, the conductive structure 402 is formed on the substrate 400. The conductive structure 402 can include at least two sub-conductive structures, such as metal wires. When the conductive structure 402 is patterned, the substrate 400 is also etched by a distance of "d". The substrate 400 usually includes a device formed thereon. Typically, an insulating layer is formed on the top for supporting the conductive structure 402. Then, a dielectric layer 404 is formed over the substrate 400. With the same mechanism as described in the first embodiment, a void 406 is formed in the dielectric layer 404 at the gap region in the conductive structure 402. The dielectric layer 404 also has an indent region above the void 406. A mask layer, such as an anti-etch layer 408, fills the indent region. Since the gap region extends in to the substrate 400, the dimension of the void 406 is increased. A dielectric layer 410 is formed on the dielectric layer 404 and the anti-etch layer 408.

In FIG. 4B, the dielectric layers 404, 410 are patterned to form an opening 412, which exposes the conductive structure 402. If misalignment occurs, the opening 412 shifts into the gap region. Since the anti-etch layer 408 has less etching rate, serving as an etching, stop or a mask, the portion of the opening 412 above the gap region stops on the anti-etch layer 408 without opening the void 406. In this embodiment, since the gap region extends into the dielectric layer, the dimension of the void 406 is increased. The parasitic capacitance of the interconnect is further reduced.

Third Embodiment

Figure 5A:
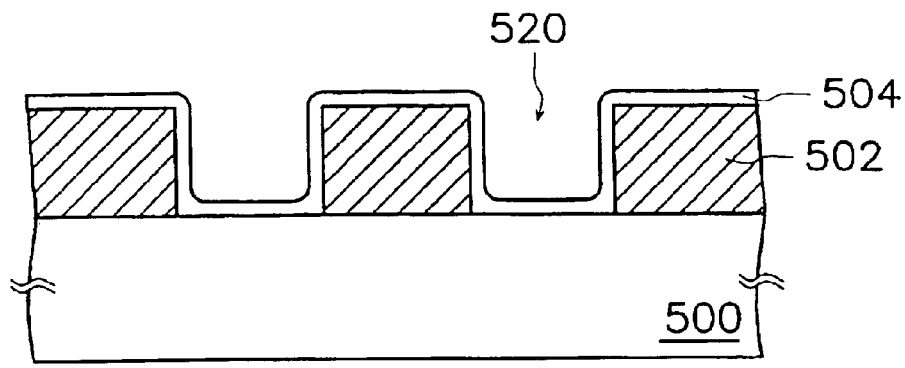
FIGS. 5A–5C are cross-sectional views, schematically illustrating a method to form an interconnect, according to a third preferred embodiment of the invention.
Figure 5B:
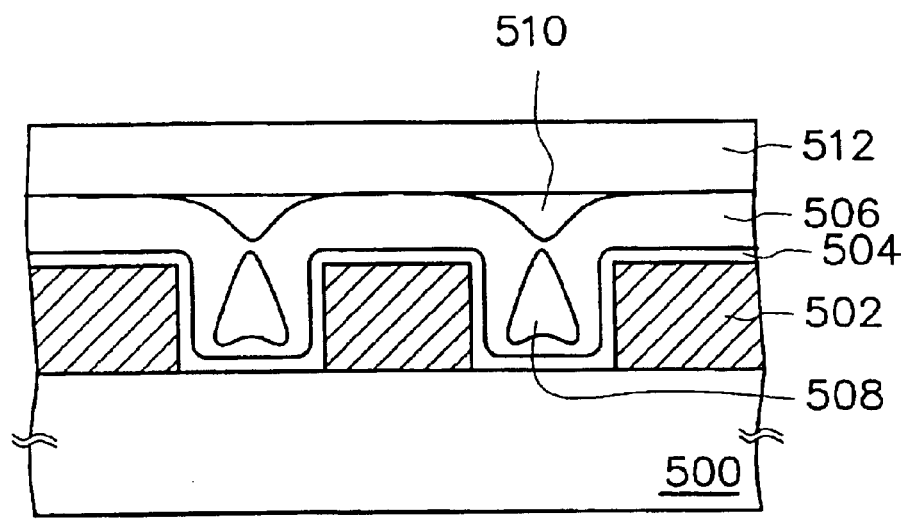
Figure 5C:
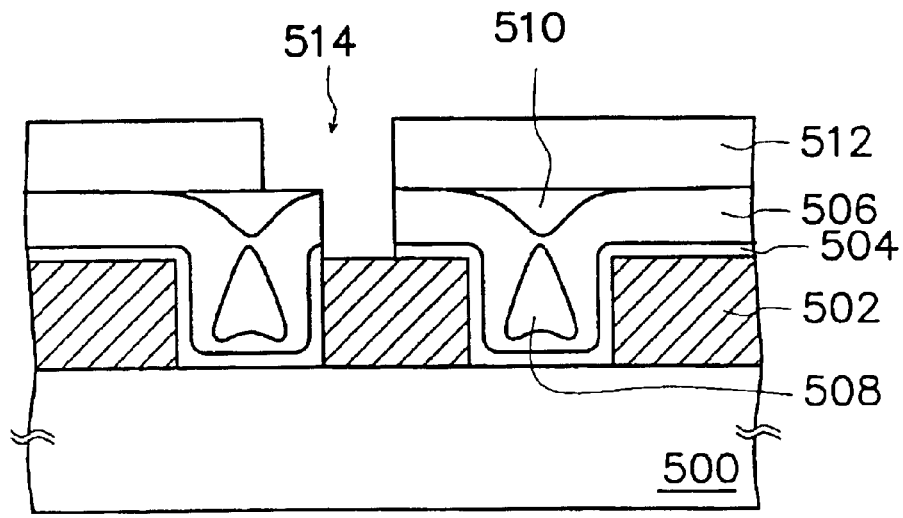

FIGS. 5A–5C are cross-sectional views, schematically illustrating a method to form an interconnect, according to a third preferred embodiment of the invention. In FIG. 5A, a conductive layer is formed on a substrate 500 and is patterned into a conductive structure 502. After patterning, the conductive structure 502 has a gap region 520, which expose the substrate 500. A liner layer 504 is formed over the substrate, conformal to a topographic surface over the substrate 500. The liner layer 504 includes, for example, oxide, nitride, silicon oxynitride, tantalum, tantalum nitride, titanium or titanium nitride.

Similar to the previous embodiment, a dielectric layer 506 is formed over the substrate on the liner layer 504 as shown in FIG. 5B. With the same mechanism, the dielectric layer 506 has a void 508 in the gap region 520. Preferably, the dielectric layer 506 includes silicon oxide or doped oxide. The dielectric layer 506 can be formed by plasma enhanced chemical vapor deposition (PECVD), and has a thickness approximately between 2000–4000 Å.

The dielectric layer 506 also has an indent region above the void 508. The indent region is filled with an anti-etching layer 510. A dielectric layer 512 is formed on the dielectric layer 506 and the anti-etch layer 510.

In FIG. 5C, the dielectric layers 510, 512 are patterned to form an opening 514 that exposes the conductive structure 502, where the liner layer 504 is also penetrated by the opening 514. If the opening 514 is misaligned, a portion of the opening 514 has overlapped over the gap region 520. Due to the anti-etch layer 510 in the indent region, the opening 514 also exposes the anti-etch layer 510 and stops there. The anti-etch layer 510 could be also etched a little without significant portion. The void 508 is not open by the opening 514.

Moreover, the gap region 520 in FIG. 5A can also extend into the substrate like the structure in FIG. 4A without a problem. Also and, the liner layer 504 can be also formed by thermal oxidation on the exposed surface of the conductive structure if the conductive structure 502 includes polysilicon.

Fourth Embodiment

Figure 6A:
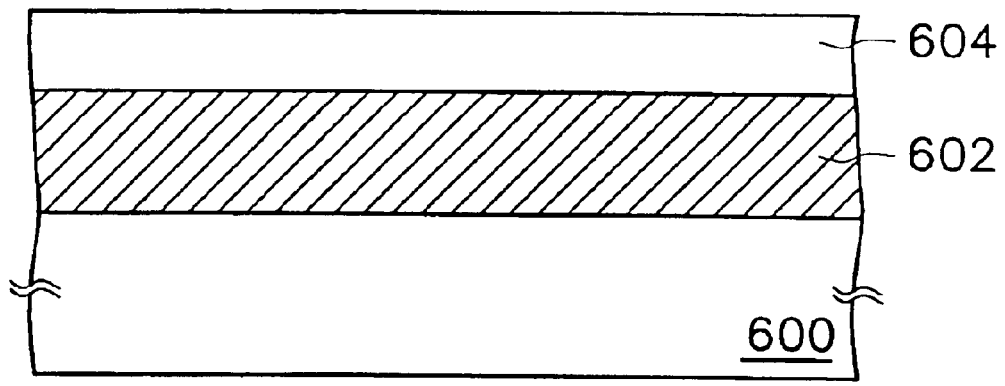
FIGS. 6A–6D are cross-sectional views, schematically illustrating a method to form an interconnect, according to a fourth preferred embodiment of the invention.

FIGS. 6A–6D are cross-sectional views, schematically illustrating a method to form an interconnect, according to a fourth preferred embodiment of the invention. In FIG. 6A, a conductive layer 602 and a dielectric layer 604 are sequentially formed on a substrate 600, which may have a device already formed thereon. The dielectric layer 604 includes a material that has a different etching rate from that of an inter-metal dielectric layer. Preferably, the dielectric layer 604 has greater etching rate than the inter-metal dielectric layer. The dielectric layer 604 has at least advantages of increasing the void size and allows a self-aligned features as to be described later. In order to have the greater etching rate, the dielectric layer 604 preferably can include a doped dielectric material, which has greater etching rate than an undoped dielectric material. The doped dielectric layer 604 includes, for example, phosphosilicate glass (PSG) or Borophosphosilicate glass (BPSG).

Figure 6B:
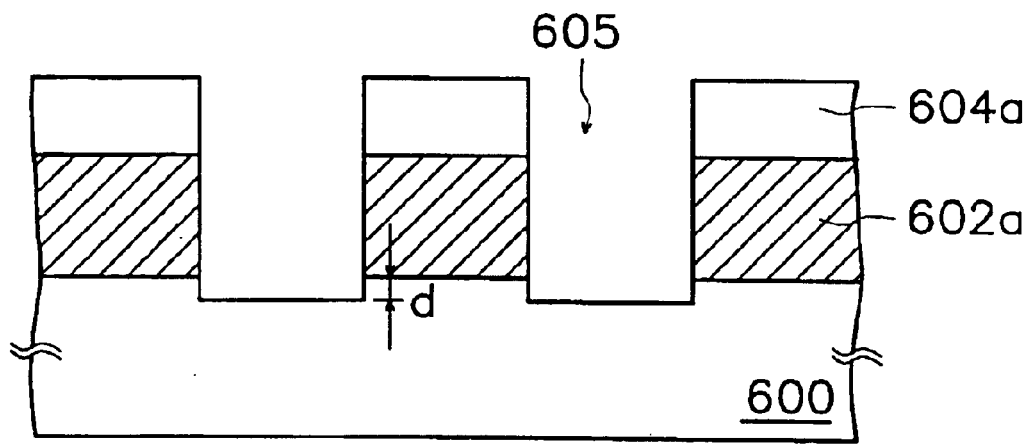

In FIG. 6B, the dielectric layer 604 and the conductive layer 602 are patterned to form a conductive structure 602a. The dielectric layer 604a is formed on the conductive structure 602. The conductive structure 602a has a gap region 605 to expose the substrate 600. Similarly, the gap region 606 may optionally extend into the substrate by a distance of "d" during patterning. Also and, a liner layer like the one in FIG. 5A can also be optionally formed on the conductive structure 602 or also on the dielectric layer 604a and the substrate 600 within the gap region 605. The dielectric layer 604 can also be called as a cap layer 604.

Figure 6C:
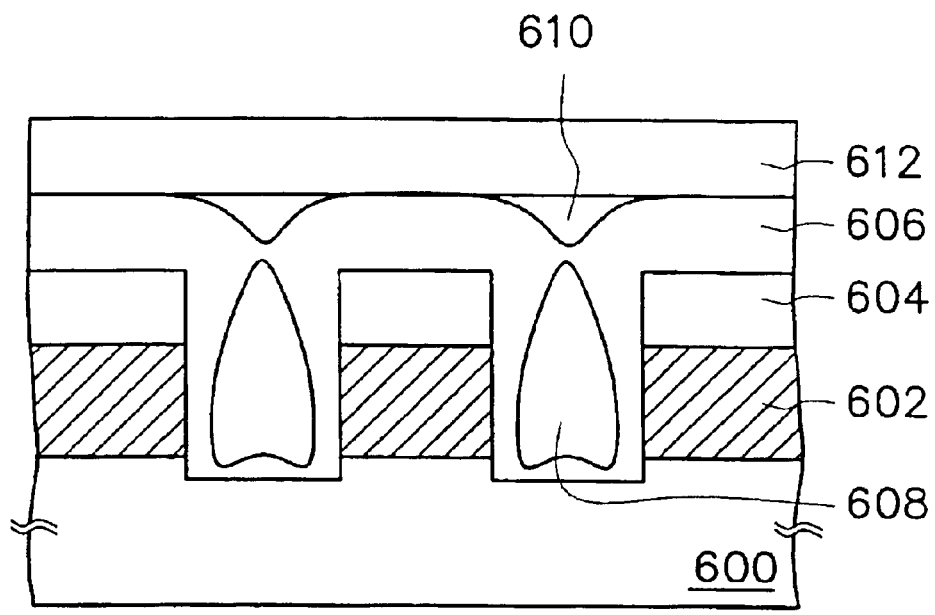

In FIG. 6C, a dielectric layer 606 is formed over the substrate 600 to cover the conductive structure 602 with the cap layer 604. With the same mechanism, a void 608 exists in the gap region 606, and an anti-etch layer 610 fills the indent region of the dielectric layer 606. The cap layer 604 provides an additional height to have larger void 608. This is one of features in this embodiment. A dielectric layer 612 is formed on the dielectric layer 606 and the anti-etch layer 610.

Figure 6D:
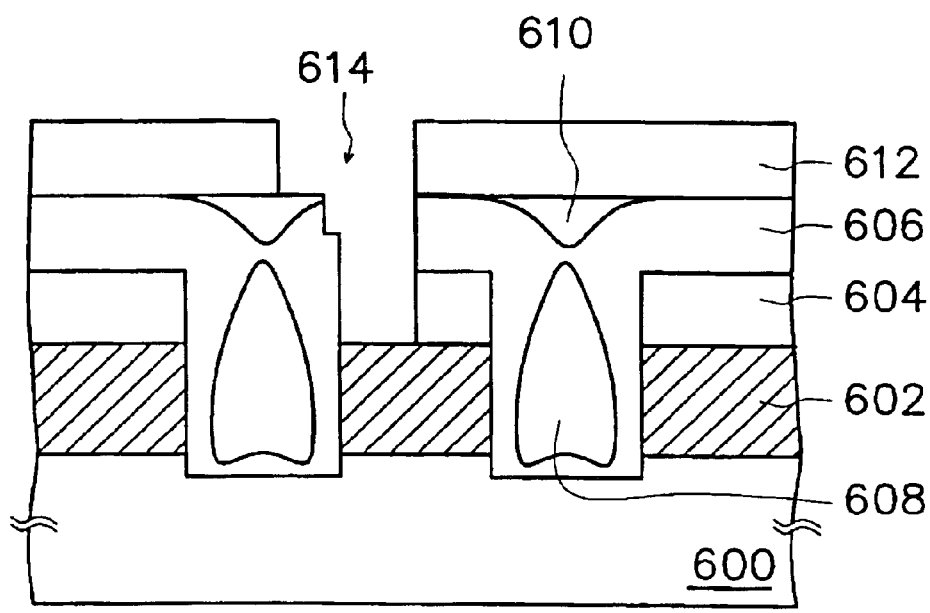

In FIG. 6D, the dielectric layers 612 and 606 are patterned to form an opening 614. The cap layer 604 is continuously etched to expose the conductive structure 602. The cap layer 604 can also be etched by changing the etchant having sufficient etching selectivity. Since the cap layer 604 has greater etching rate than the dielectric layers 612 and 606, the cap layer 604 is etched with self-aligned property when the etching process reaches the cap layer 604. The self-aligned manner is also one of features of the invention.

The anti-etch layer 610 mask the void 608 to prevent the void 608 from being open. Here, if one looks into the anti-etch layer 610 in more detail, the anti-etch layer 610 may also be etched a little portion. In the invention, if the indent region is formed by using property of step coverage, the rim region is thinner and could be etched also. Even so, the anti-etch layer 610 also provide a buffer effect, so that the opening 614 do not opening the void 608. This phenomenon may occur in the embodiments of the invention. However, it still has sufficient distance between the anti-etch layer 610 and the void 608 at the rim region. In fact, the area of the anti-etch layer 610 to mask the void 608 and its geometrical structure are the fabrication choices.

Fifth Embodiment

Figure 7A:
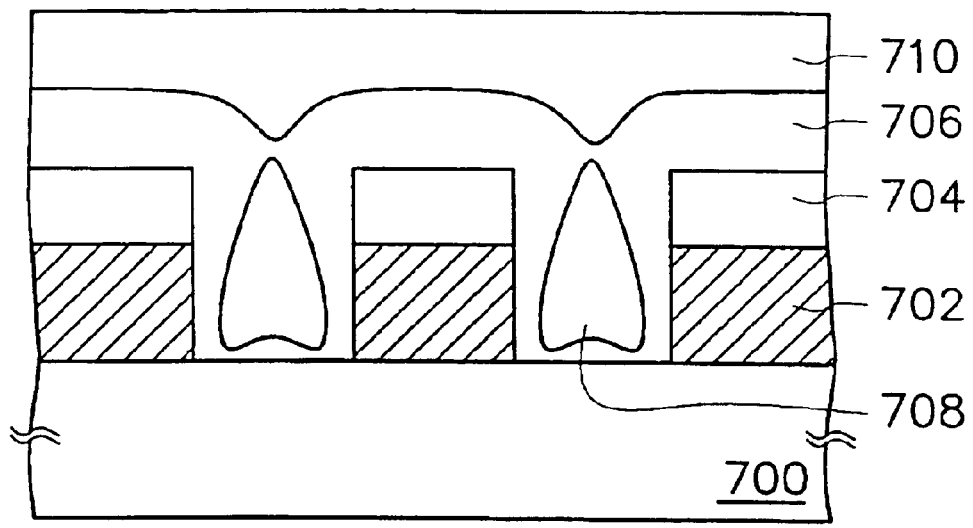
FIGS. 7A–7B are cross-sectional views, schematically illustrating a method to form an interconnect, according to a fifth preferred embodiment of the invention.

In the previous embodiment, the anti-etch layer is included to fill the indent region. However, the anti-etch layer is not absolutely necessary. In FIG. 7A, similar to FIG. 6C, the void 708 is formed in the gap region of the conductive structure 702. The gap region optionally does not extend into the substrate 700. A cap layer 704 is formed on the conductive structure 702. A dielectric layer 706 is formed over the substrate 700 to cover the conductive structure 702 with the cap layer 704. The cap layer 704 including a material, such as doped dielectric, has greater etching rate than the dielectric layer 706. A dielectric layer 710 is formed on the dielectric layer 706. The dielectric layer 710 may also be planarized by, for example, a chemical mechanical polishing process. In this embodiment, the indent region of the dielectric layer 706 is not filled by a mask layer.

Figure 7B:
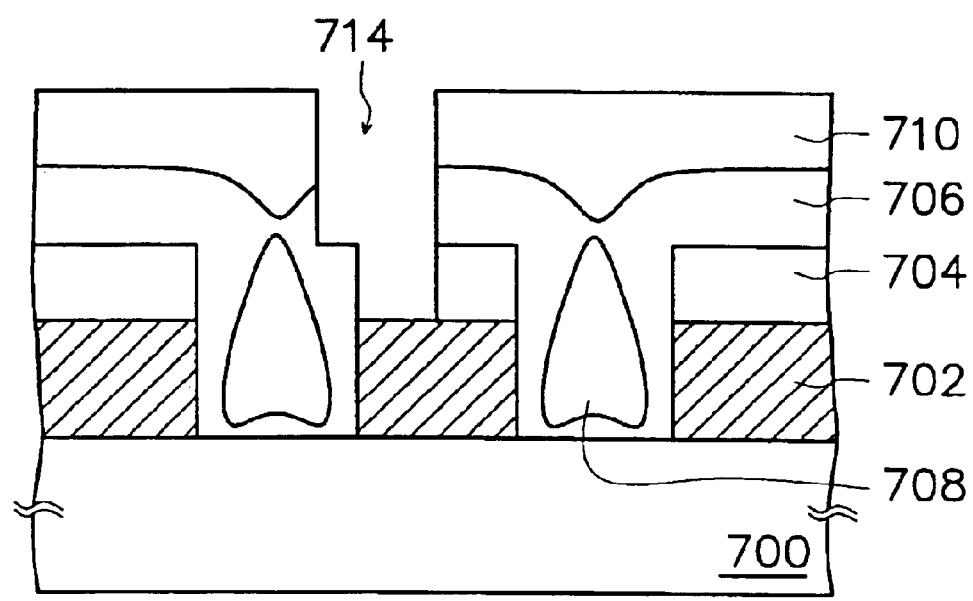

In FIG. 7B, the dielectric layers 710 and 706 are patterned to form an opening 714. When the opening 714 reaches to the cap layer 704, since the cap layer 704 has faster etching rate, the cap layer 704 can be etched with self-aligned property even though the anti-etch layer is absent; Alternatively, the opening 714 can stop on the cap layer 704 first by choosing a first etching selectivity, and penetrate the cap layer by choosing a second etching selectivity. In this alternative manner, the cap layer and the dielectric layer 706 have different etching rates in the two stages. However, the cap layer has the greater etching rate at the second stage.

Figure 8A:
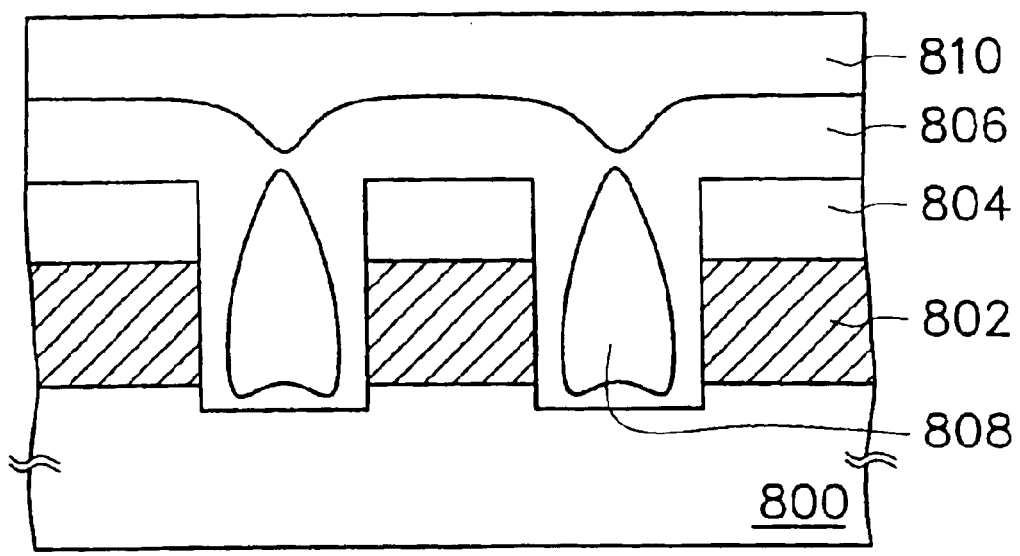
FIGS. 8A–8B are cross-sectional views, schematically illustrating a method to form an interconnect with increased void size, according to the fifth preferred embodiment of the invention.
Figure 8B:
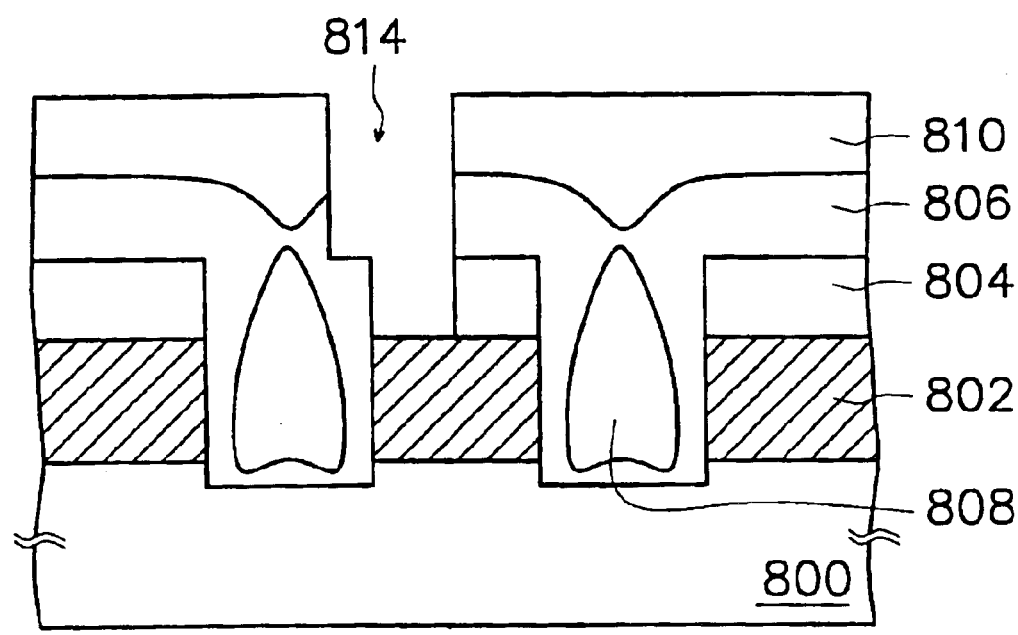

FIGS. 8A–8B are cross-sectional views, schematically illustrating a method to form an interconnect with increased void size, according to the fifth preferred embodiment of the invention. The interconnect structure formed in FIG. 8B is similar to the structure in FIG. 7B. The difference is that the gap region has extended into the substrate 800. In FIG. 8A, the conductive structure 802 is formed on the substrate 800. A cap layer 804 is form on the conductive structure 802. The dielectric layer 806 is formed over the substrate 800 to cover the conductive structure 804, in which the void 808 exists due to the loose step coverage. A dielectric layer 810 is formed on the dielectric layer 806. The gap region in the conductive structure 802 expose the substrate 800 and extends into the substrate 800.

In FIG. 8B, the dielectric layers 806 and 810 are patterned to form an opening 814. The opening 814 continuously penetrates the cap layer 804 to expose the conductive structure 802. The cap layer 804 has faster etching rate than the dielectric layer 806. The etching mechanism in FIG. 8B is similar to that in FIG. 7B. If misalignment occurs, the opening 814 does not open the void 808 due to a faster etching rate on the cap layer 804.

In conclusion, the present invention has several features as follows:

1. The invention uses properties of step coverage by operating at a condition of the loose step coverage or the poor step coverage, so as to form the void at the gap between metal wires with intention. The parasitic capacitance of the interconnect can be effectively reduced.

2. In order to increase the void size, the gap can extend into the substrate.

3. The anti-etching layer 207a is formed above the void to mask the void. As a result, the void is not open.

4. The cap layer 704 is further formed on the conductive structure. The cap layer provides an addition height of the gap region, so as to indirectly increase the void size. The cap layer also allows a self-aligned manner to be performed during fabrication.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor interconnect structure, comprising:
   a conductive structure on a substrate;
   a cap layer disposed on the conductive structure; and
   a first dielectric layer over the conductive structure, wherein at least a portion of sidewalls of the conductive structure and the cap layer are surrounded by first level air gaps, an opening disposed over at least part of a surface of the conductive structure, wherein the first level air gaps are isolated from the opening.

2. The interconnect structure of claim 1, wherein the conductive structure comprises a aluminum, copper, tungsten, polysilicon, metal, and metal alloy thereof.

3. The interconnect structure of claim 1, wherein the material of the cap layer comprises doped dielectric.

4. The interconnect structure of claim 1, wherein the material of the cap layer and the first dielectric layer are different.

5. The interconnect structure of claim 1, wherein the etching selectivity of the cap layer with respect to the first dielectric layer is substantially high.

6. The interconnect structure of claim 1, wherein the first dielectric layer comprises silicon oxide.

7. The interconnect structure of claim 1, wherein the first dielectric layer comprises dope oxide.

8. The interconnect structure of claim 1, wherein the first dielectric layer is formed by using a plasma enhanced chemical vapor deposition method (PECVD).

9. The interconnect structure of claim 1, further comprising a second dielectric layer disposed over the first dielectric layer, wherein the opening exposes the conductive structure through the first dielectric layer and the second dielectric layer.

10. The interconnect structure of claim 9, wherein the second dielectric layer comprises silicon oxide.

11. The interconnect structure of claim 1, wherein the level of the top surface of the conductive structure is lower than a level of an interface between the first level air gaps and the first dielectric layer corresponding to a level between the conductive structure and the substrate.

12. The interconnect structure of claim 1, wherein a height of an interface between the first level air gaps and the substrate is higher than a height of an interface between the conductive structure and the substrate.

13. The interconnect structure of claim 1, wherein the width of the opening is substantially equal to the width of the conductive structure.

14. The interconnect structure of claim 1, further comprising a layer over the first dielectric layer, wherein the layer is disposed over the first level air gaps and the opening disposed over at least a portion of the layer.

15. The interconnect structure of claim 14, the width of the layer is substantially equal to the width of the opening.

16. A semiconductor interconnect structure, comprising:
   a conductive structure on a substrate;
   a cap layer disposed on a portion of a top surface of the first conductive level conductive structure, the cap layer having a top surface, a first side surface and a second side surface, wherein the conductive structure and a lower portion of the first side surface of the cap layer are surrounded by first level air gaps and an upper portion of the first side is surrounded by the a first dielectric layer; and
   an opening disposed over an upper portion of the conductive structure, the second side surface of the cap layer, and a portion of the first dielectric layer, wherein the first level air gaps are isolated from the opening by the first dielectric layer.

17. The interconnect structure of claim 16, wherein the conductive structure comprises a aluminum, copper, tungsten, polysilicon, metal, and metal alloy thereof.

18. The interconnect structure of claim 16, wherein the material of the cap layer comprises doped dielectric.

19. The interconnect structure of claim 16, wherein the material of the cap layer and the first dielectric layer are different.

20. The interconnect structure of claim 16, wherein the etching selectivity of the cap layer with respect to the first dielectric layer is substantially high.

21. The interconnect structure of claim 16, wherein the first dielectric layer comprises silicon oxides.

22. The interconnect structure of claim 16, wherein the first dielectric layer comprises doped oxides.

23. The interconnect structure of claim 16, wherein the first dielectric layer is formed by using a plasma enhanced chemical vapor deposition method (PECVD).

24. The interconnect structure of claim 16, further comprising a second dielectric layer disposed over the first dielectric layer, wherein the opening exposes the conductive structure through the first dielectric layer and the second dielectric layer.

25. The interconnect structure of claim 24, wherein the second dielectric layer comprises silicon oxides.

26. The interconnect structure of claim 16, wherein the level of the top surface of the conductive structure is lower than a level of an interface between the first level air gaps and the first dielectric layer corresponding to a level between the conductive structure and the substrate.

27. The interconnect structure of claim 16, wherein a height of an interface between the first level air gaps and the substrate is higher than a height of an interface between the conductive structure and the substrate.

28. The interconnect structure of claim 16, wherein the width of the opening is substantially equal to the width of the conductive structure.

29. The interconnect structure of claim 16, further comprising a layer over the first dielectric layer, wherein the layer is disposed over the first level air gaps and the opening disposed over a portion of the layer.

30. The interconnect structure of claim 16, the width of the layer is substantially equal to the width of the opening.

31. A semiconductor interconnect structure, comprising:
   a pair of conductive structures;
   a first dielectric layer over the conductive structure, wherein a first level air gap disposed between the conductive structures in the first dielectric layer;
   an opening disposed over at least part of the conductive structure, wherein the first level air gap is isolated from the opening; and
   a cap layer disposed on a portion of a top surface of the first conductive level conductive structure, the cap layer having a top surface, a first side surface and a second side surface, the first side surface having a lower portion beside the first level air gap and an upper portion surrounded by a first dielectric layer; the opening disposed over the second side surface of the cap layer and isolated from the first level air gap.

32. The interconnect structure of claim 31, further comprising an etching stop layer over the first dielectric layer, and substantially disposed over the first level air gap, wherein the first level air gap is isolated from the opening by the etching stop layer.

33. The interconnect structure of claim 32, wherein the etching selectivity of the first dielectric layer with respect to the etching stop layer is substantially high.

34. A semiconductor interconnect structure, comprising:
   a pair of conductive structures, wherein an air gap disposed between the conductive structures;
   a dielectric layer over the conductive structures, the dielectric layer having a stop layer disposed over the air gap, wherein the dielectric layer has an opening exposing a portion of the conductive structure and being isolated from the air gap; and
   a cap layer disposed on a portion of a top surface of the conductive structure, the cap layer having a top surface, a first side surface and a second side surface, the first side surface having a lower portion beside the air gap and an upper portion surrounded by the dielectric layer, the opening being disposed over the second side surface of the cap layer and isolated from the air gap.

35. A semiconductor interconnect structure, comprising:
   a pair of conductive structures, wherein an air gap disposed between the conductive structures;
   a dielectric layer over the conductive structures, the dielectric layer having a stop layer disposed over the air gap, wherein the dielectric layer has an opening disposed over at least a portion of the conductive structure and at least a top portion of the stop layer, the opening being isolated from the air gap; and
   a cap layer disposed on a portion of a top surface of the conductive structure, the cap layer having a top surface, a first side surface and a second side surface, the first side surface having a lower portion beside the air gap and an upper portion surrounded by the dielectric layer, the opening being disposed over the second side surface of the cap layer and isolated from the air gap.

* * * * *